June 11, 1963 WOO F. CHOW 3,093,802

CONTROLLABLE SIGNAL TRANSMISSION NETWORK

Filed Feb. 25, 1959

INVENTOR:
WOO F. CHOW,

BY Walter C. Bernkopf

HIS ATTORNEY.

United States Patent Office 3,093,802

Patented June 11, 1963

3,093,802

CONTROLLABLE SIGNAL TRANSMISSION NETWORK

Woo F. Chow, Syracuse, N.Y., assignor to General Electric Company, a corporation of New York Filed Feb. 25, 1959, Ser. No. 795,415

3 Claims. (Cl. 330—145)

My invention relates to a signal transmission network and more particularly to a signal transmission network whose transfer function is controlled by an applied voltage control signal.

Signal transmission networks whose transfer functions may be controlled by the amplitude of an applied control voltage are required in many kinds of transmission systems. Such networks are utilized where signal amplitude is controlled from a remote source and, more commonly, in automatic gain control systems. Automatic gain control (AGC) systems are employed in signal translating apparatus, such as radio receivers, to maintain the signal input intensity at the detection stage within a relatively narrow range substantially unaffected by fluctuations in received signal intensities. This minimizes variation in the intensities of the output signal of the sound reproducer which are caused by atmospheric conditions or by tuning the receiver between transmitting stations having substantially different transmitting power. Automatic gain control is realized by returning a unidirectional voltage whose magnitude is indicative of the intensity of the signal appearing at the detector, to vary the gain of one or more amplifying stages preceding the detector in accordance with the intensity of the signal at the detector.

In vacuum tube circuitry signal transfer control has been effected commonly by controlling the bias of control electrodes so as to change the tube transconductance and thus the amplification. Thus in the development of vacuum tube circuitry many AGC circuits have been devised to accomplish amplitude stabilization of amplified waves and in the great majority of cases such stabilization has been accomplished by returning a portion of a detected signal for control of one or more tubes in amplifying stages preceding the detector. The control electrode to which the detected signal is fed in most cases is the control grid; however, methods have been utilized wherein the signal is returned to the cathode or screen grid of an electrode tube.

With the advent of semiconductor circuits, e.g. transistor radio circuits, the same procedure of obtaining gain control in response to the amplitude of a unidirectional signal, namely controlling electrode bias, has often been followed. Gain control of transistor amplifiers has been achieved by controlling the emitter bias current either directly or through the base, controlling the collector bias voltage either directly or through the base, or controlling both the emitter bias current and the collector bias voltage.

When emitter bias current or collector bias voltage control are used either separately or in conjunction a problem is presented in that reductions of emitter current and/or collector voltage are required to reduce amplifier gain. However, signal amplification of large amplitude input signals necessitates that a large emitter bias current and a large collector bias voltage be applied to the transistor to avoid clipping or limiting the incoming signal. Therefore, the above recited conventional methods of transfer control, depending upon gain control of a semiconductor device, limits the dynamic signal handling range of the gain-controlled transistor, i.e. the range of input signal variation.

Transfer control has also been achieved by means of attenuation networks which may be utilized as an alternative or as a supplement to the gain control circuits discussed above. Networks whose attenuation is controlled by the amplitude of an applied control voltage may be inserted serially in signal transfer networks. Such attenuation networks generally are of the voltage divider type in which an impedance is connected across the source and a variable portion of the impedance is connected across the load. Such networks may employ a voltage controllable impedance device connected in shunt or in series circuit with the load circuit and may employ a combination of devices connected in shunt and in series. Such circuits generally have disadvantages relating to large insertion losses, detrimental effects on the network input and output in view of variations in impedance and the requirement of relatively large control currents. For example, provisions have been made to use a shunt diode across the input of an amplifier with the diode biased forward to attenuate the incoming signal or alternatively to use a diode in series with the amplifier input with the diode biased in reverse to attenuate the incoming signal, the bias in both cases being derived from a unidirectional control signal.

The disadvantage of gain control systems using forward biased diodes to increase the dynamic signal handling range of a gain control system is that the impedance of the diode does not decrease substantially until the diode biasing current reaches a substantial value. For example, when the input impedance of a transistor is low, as in the case of a RF amplifier at very high frequency, the current in the forward biased diode has to be large in order to decrease the diode impedance. Provision of a large gain control current to decrease the diode impedance in an AGC system results in a large current drain on the detector output and hence less power in the output. Thus, it is readily apparent that the addition of forward biased diodes in an AGC system to increase the dynamic signal handling range of a transistor amplifier demands a sacrifice of detector current and hence subtracts power from the output of the receiver.

In overcoming the above-mentioned deficiencies and limitations of existing signal transfer control arrangements, I provide an attenuation control system that draws no appreciable gain control current, does not affect electrode bias of associated amplifiers and which allows a large dynamic signal handling range, thereby avoiding any clipping or limiting effects on an applied signal.

Accordingly, it is an object of my invention to provide a system for controlling the gain of signal translating apparatus in response to the voltage amplitude of a control signal which requires reduced power from the control signal source.

It is another object of my invention to provide a gain control system for semiconductor amplifiers which avoids any clipping or limiting effects on an applied wave.

It is a further object of my invention to provide an AGC system for transistor amplifiers which allows a transistor amplifier to handle input signals of large dynamic range without distortion.

It is a still further object of my invention to provide an AGC system for a transistor amplifier wherein the emitter bias current and collector bias voltage may be designed independently of AGC considerations.

These and other objects of my invention are achieved in a novel system for controlling signal attenuation in response to the voltage amplitude of a control signal. The signal to be controlled is separately applied to separate circuit branches, each containing an impedance, and then is recombined in opposite, or subtractive, phase. The resulting net signal is applied to a load circuit, such as a transistor amplifier. The impedance in at least one of the circuit branches is voltage controllable, and is preferably a voltage controllable capacitance, such as a back-biased junction diode. Generally the magnitude of one impedance is held constant and the magnitude of the second impedance is controlled by a control voltage. When voltage controllable capacitances are employed the necessary control power is very low. When it is desired to increase attenuation, a control signal is applied to the second impedance so as to make its impedance magnitude approach equality in value with the impedance magnitude of the first impedance. The separated signal components of relatively equal amplitude are thus applied in opposite phase to the load so that only a small difference, or net, signal is applied to the load. If it is desired to increase gain, the gain control voltage is varied so that the magnitude of the second impedance diverges from that of the first impedance. The result of such action being a larger net signal applied to the amplifier.

The features of the invention which are believed to be novel are set forth with particularity in the appended claims. The invention itself, however, both as to its organization and method of operation together with further objects and advantages thereof, may best be understood by reference to the following description when taken in connection with the following drawings, wherein:

Figure 1:
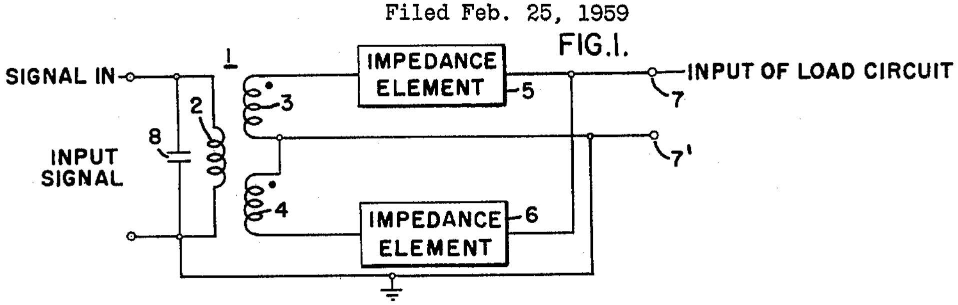
FIGURE 1 shows an illustrative embodiment of my invention.

In FIGURE 1 my invention is shown in simplified form. A radio frequency (RF) signal is applied to transformer 1 having a primary winding 2 and secondary windings 3 and 4 which may be identical but are poled as indicated in the drawing. The secondary winding 3 has one terminal of reference polarity connected to an impedance 5 and the other terminal to a common terminal 7′ whch is illustrated to be grounded. Secondary winding 4 has one terminal of opposite polarity connected to impedance 6 and the other terminal of reference polarity to terminal 7′. Impedance elements 5 and 6 are connected to output terminal 7 which is adapted to be connected to a load, such as the input of a semiconductor amplifier. The primary winding 2 of transformer 1 may be tuned to a desired frequency by capacitor 8. At least one of the impedances 5 or 6 is of controllable magnitude and they are usually selected to be of like impedance at some point in adjustment.

In operation an RF signal is applied to the primary of the transformer 2 and equal magnitude signals appear on secondary windings 3 and 4. If the two impedances, 5 and 6, have the same impedance magnitude under a particular condition, the signals when combined in opposite phase at the input, 7, of the load circuit will cancel and the RF signal will be greatly attenuated. When the two impedances, 5 and 6, are not equal in magnitude there will be an RF signal at the load input 7. If now one of the impedances is voltage controlled and should vary in magnitude in accordance with a control signal, an RF signal whose amplitude is a function of the magnitude of the control signal will appear at the load input 7. In effect my control circuit comprises a bridge circuit connected to the load circuit. A voltage controllable capacitance is preferably employed as a voltage-controllable impedance in view of the low control current requirement. Back-biased junction diodes may be utilized for this purpose.

It is known that a back-biased junction diode, which may be of silicon or germanium, displays a capacitance whch is a function of the back-bias potential. At a P-N junction the density of charge carriers is reduced essentially to zero when a voltage is applied across the junction in the direction reverse to the direction of easy current flow. This region of zero charge density becomes wider with an increase in voltage and in effect moves apart the two conducting regions and thereby decreases the capacity, as if the P and N regions were two metal plates separated by a variable thickness dielectric.

The leakage current of the P-N junction diode is the reverse current of the junction operating as a diode with a reverse voltage applied. In a silicon diode, the leakage current is extremely small, causing the back-biased diode to act like a capacitor with a very high shunt resistance. Inasmuch as the series resistance of the diode in the easy conduction direction is low, the reactance-to-resistance ratio will be high enough to fulfill the requirements of many capacitor applications.

Figure 2:
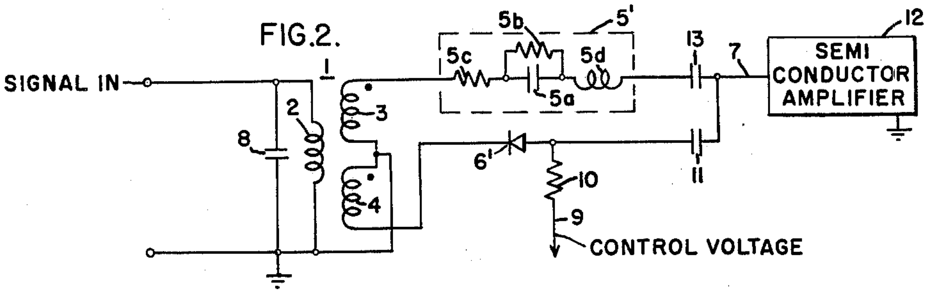
FIGURE 2 shows an embodiment of my invention using a lumped RLC network as a fixed impedance and a back-biased junction diode as a controllable impedance.

Referring now to FIGURE 2 wherein like elements to FIGURE 1 bear like identifying numerals, I have shown the impedance 5′ as consisting of a lumped RLC network. This network comprises a capacitor *5a*, a shunt resistance *5b*, series resistance *5c* and series inductance *5d*. The second impedance, 6′, which is voltage controllable, comprises a back-biased junction diode, the back-bias voltage being supplied by the control signal. The fixed impedance network 5′ could comprise only capacitor *5a* having a capacitive value which may equal the capacitive value of the junction diode when back-biased by the maximum control signal. However, for better circuit balance resistor *5b* corresponding in value to the back resistance of the diode is shunted across capacitor *5a*. A resistor *5c* corresponding in value to the loss resistance of the P-N junction is placed in series with capacitor *5a*. The inductance *5d* corresponding to the lead inductance of the P-N junction is also placed in series with the capacitor *5a*.

A control signal is applied over line 9 from a source (not shown) to back-bias the voltage controllable impedance 6′. A decoupling resistor 10 is included in line 9 to prevent an incoming R-F signal from feeding to the control source. A capacitor 11 is in series with diode 6′ to block the control signal from the input 7 of the load, shown to be semiconductor amplifier 12. In the particular embodiment shown in FIGURE 2, the capacitor 13 in series with impedance 5 is included to balance capacitor 11.

In operation, when the control signal is of such magnitude that the capacitive value of the back-biased diode 6′ approaches the capacitive value of capacitor *5a*, the signals passed by capacitors 11 and 13 will approach equality in magnitude but will be opposite in phase and therefore the net signal appearing at input 7 to the transistor amplifier will be small. If now the control voltage is decreased, the back-bias on diode 6′ will decrease in magnitude and the capacitance of the P-N junction will increase, resulting in a difference in the capacitive value of the parallel impedances *5a* and 6′ and therefore a net signal will appear at the input 7 of the transistor amplifier 12.

Figure 3:
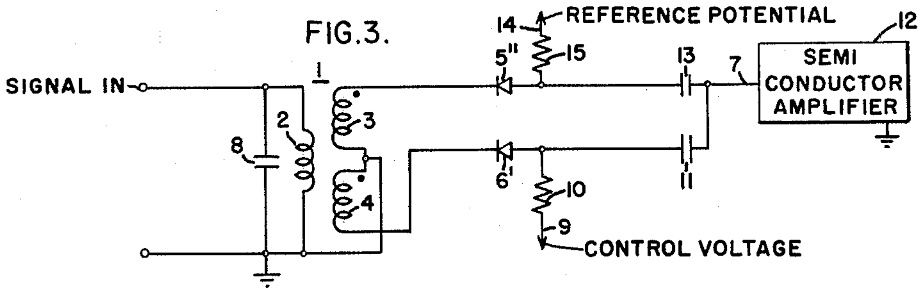
FIGURE 3 shows an embodiment of my invention using two junction diodes as impedance elements.

Referring now to FIGURE 3 where elements corresponding to those of FIGURE 2 bear the same numeral identification, I show controllable impedance elements 5″ and 6′ as back-biased junction diodes coupled to the input 7 of the load, illustrated as semiconductor amplifier 12, through coupling capacitors 11 and 13. Diode 5″ is back-biased by a reference potential which may be equal to the maximum expected control voltage, over line 14 from any suitable voltage source (not shown). In the illustrated embodiment the reference potential and the control potential are negative in respect to the common ground terminal. A decoupling resistor 15 is provided in line 14 to prevent an incoming R-F signal from feeding to the reference potential source. The bias voltage upon diode 5″ is non-variable, therefore the capacitive reactance value, and impedances of diode 5″ remains constant at the operating frequency.

Operation of the circuit of FIGURE 3 corresponds basically to the circuit of FIGURE 2. The disclosed circuits may be employed in the automatic gain control system of a signal translating network if the control voltage is a function of the output signal amplitude of the network, i.e. the control voltage corresponds to the AGC voltage of a standard AGC system. Assuming the control voltage of the circuit of FIGURE 3 to vary proportionately to such an output signal amplitude, there will be little or no gain control signal when the R–F signal applied to the primary winding 2 of transformer 1, is small and, consequently, diode 6′ will have a small bias voltage applied thereto. The impedance of diode 5″ will exceed that of diode 6′ and a net R-F signal will be applied to the input 7. If now the R-F input signal will increase in intensity, the control signal will increase, increasing the bias, and, therefore, the capacitive reactance of diode 6′ thereby decreasing the net R-F signal appearing at input 7. It is important to emphasize that diodes 5″ and 6′ are back-biased, thereby drawing no appreciable current.

Figure 4:
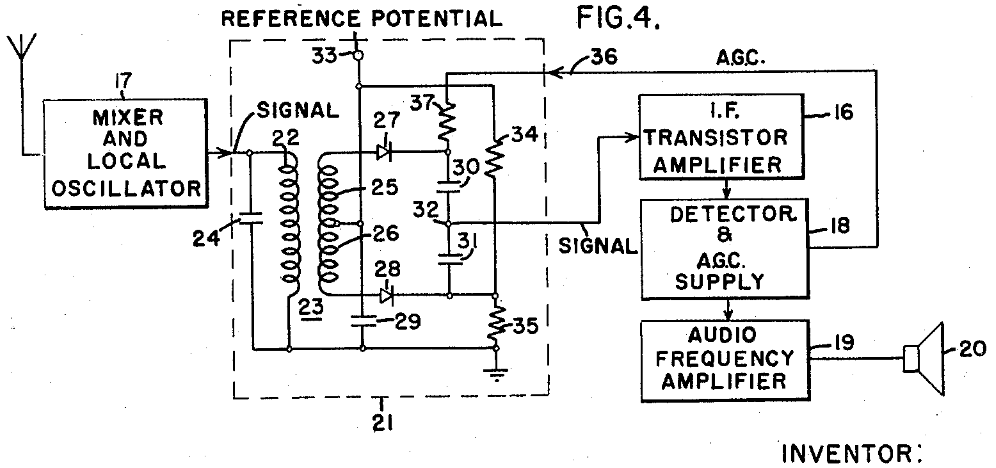
FIGURE 4 is illustrative of an embodiment of my invention incorporated in a radio receiver wherein the active elements are transistors.

Turning now to FIGURE 4, I have illustrated an embodiment of my invention utilized in an AGC circuit of a radio receiver and located just prior to an IF transistor amplifier 16. The radio receiver may comprise a mixer and local oscillator 17, IF amplifier 16, a detector and AGC supply 18 and an audio-frequency amplifier 19 driving speaker 20, the elements being connected in the order given. These elements have been illustrated in block form since conventional circuits may be employed. The foregoing mentioned elements of the receiver do not constitute part of my invention which is illustrated within the dotted lines 21, and it should be noted that signal transfer control can be effected in the R-F circuitry, the IF circuitry or both, and that the present arrangement is only described as an illustrative example. It is additionally possible to cascade a number of control stages in order to increase the dynamic range of gain control. The output of the mixer-local oscillator 17 is applied to the primary winding 22 of transformer 23. The primary winding 22 and capacitor 24 comprise a resonant circuit tuned to the IF frequency. The transformer 23 has a center tapped secondary winding comprising portions 25 and 26, which supply equal magnitude but opposite phase components of an applied signal to back-biased junction diodes 27 and 28, one component to each diode. The center tap of the secondary winding is connected to ground through an R-F by-pass capacitor 29. The outputs of diodes 27 and 28 are coupled through capacitors 30 and 31, respectively, to point 32 which is in turn connected to the input of amplifier 16. Diode 28 is back-biased by a reference potential. As illustrated the source of reference potential 33 is connected to the center tap of the transformer secondary windings, and is additionally connected to the voltage divider network comprising serially connected resistors 34 and 35. The junction between these resistors is connected to the cathode of diode 28, so that the static D.-C. back-bias across diode 28 approximates the difference between the reference voltage, and the potential at the voltage divider junction supplied to the cathode of the diode. In the illustrated embodiment the reference potential is at a fixed negative potential to ground. The AGC potential applied to diode 27 is such that the diode is back-biased varying from about zero volts to a magnitude corresponding to the maximum AGC potential. The diode 28 has constant potential back-bias corresponding to the maximum AGC voltage. The AGC voltage is applied to diode 27 from AGC source 18 over line 36 which includes decoupling resistor 37 to prevent feeding of an applied R-F signal into the AGC source 18.

Considering now the operation of the radio receiver shown in FIGURE 4, a received R-F signal is mixed with a local oscillator signal by mixer 17, and the resulting IF signal is applied to the primary winding 22 of transformer 23. Due to transformer action, the IF signal appears as opposite phase components at diodes 27 and 28. If the impedances of diodes 27 and 28 should be equal it may be readily seen that no resultant IF signal will appear at the input of IF amplifier 16. However, the capacitance of diode 27, and hence its impedance is varied by the AGC voltage. The magnitude of the AGC voltage depends upon the intensity of the signal at the detector 18 and any change in the intensity of the signal at the detector results in a change in the impedance of diode 27. If the signal received by the radio receiver is of low intensity, the AGC signal will be of small magnitude and a small bias will be applied to diode 27, decreasing its impedance with respect to diode 28. When the impedances of diodes 27 and 28 are unequal a net signal voltage will be applied to amplifier 16. Should the intensity of the received signal increase, the AGC signal will increase in magnitude and diode 27 will be more heavily biased thereby having its impedance approach that of diode 28. The net signal coupled through by-pass capacitors 30 and 31 to amplifier 16 will decrease, thereby maintaining the amplitude of the detector output substantially constant.

It is now apparent that I have provided a gain control system for controlling, without clipping or limiting, the dynamic range of a signal and which requires substantially no control power and depends entirely on control voltage levels. Further, it may be seen that my control system does not require change in the bias of any associated amplifier electrodes. Still further, it may be seen that in designing the bias points of an associated semiconductor amplifier, gain control or AGC considerations will present no problem.

In practicing my invention, I prefer to use matched silicon diodes; however, it should be understood that this is not essential. For example, I might use one passive impedance element and one voltage-controlled impedance element as illustrated in FIGURE 2; furthermore, if two controllable impedance elements are used, they may be of different impedance values in the unbiased condition. In some instances, to prevent the gain control voltage from reaching a magnitude which would increase the impedance of the gain voltage-controlled impedance to a value greater than that of the reference impedance, it may be desirable to provide a limiting circuit to limit the magnitude of the gain control voltage applied to the controlled impedance.

Design considerations of a circuit embodying my invention will be apparent to one skilled in the art; however, for purposes of illustration, the components and signal parameters of an operative embodiment of the circuit shown in FIGURE 3 are: The diodes 5″ and 6′ are silicon P-N junction diodes where the capacitance is varied with V, where V is the reverse voltage applied to the diode. The diodes should be selected so that the maximum applied signal does not exceed the permissible voltage range of the diode which extends from the Zener voltage region to the point of forward conduction. The D.-C. decoupling resistors 10 and 15 are not critical in value but need only be much larger than the load impedance. The value of the by-pass capacitors 11 and 13 need only be selected to provide a low A.-C. impedance at the signal frequency. The AGC voltage, in the circuit of FIGURE 3 varied from 0 to −6 volts. Of course, the bias voltage on the diodes 5″ and 6′ always exceeds the amplitude of the input signal so that there is no conduction of the applied signal in the forward direction. Secondary windings 3 and 4 are identical but are wound so as to have opposite phase relationship, as shown in FIGURE 3. The turns ratio, N, of the primary winding to each of the secondary windings was so chosen so that the impedance of the input signal source and the load impedance are related by $R_G = N^2 R_L$, where $R_G$ represents the source impedance and $R_L$ represents the load impedance.

In one specific embodiment of the invention illustrated in FIGURE 3, the following components were employed:

| | |
|---|---|
| Resistors **15** and **10** | 10,000 ohms. |
| Capacitors **11** and **13** | .01 mfd. |
| Diodes 5″ and **6′** | Silicon junction diodes—Pacific Semiconductor Varicap type V20. |
| Control voltage | 0 to −6 volts. |
| Reference voltage | −6 volts. |
| Input signal frequency | 10 mc. |
| Input signal amplitude | Approximately 1 microvolt to 1 millivolt. |
| Load impedance | 200 ohms. |

The above-mentioned values and parameters are shown by way of illustration only and my invention, of course, is not limited to a circuit having the relative values shown.

While I have illustrated and described my invention as applicable to a simple AM radio receiver, it should be apparent that the invention may be applicable to any circuit in which a gain control voltage is available which is a function of the desired output signal intensity. It should be understood that my invention is not limited to the disclosed embodiments and that other uses, applications and modifications will occur to those skilled in the art. It is therefore intended in the appended claims to claim all such variations and modifications as fall within the spirit of the present invention.

What I claim as new and desire to secure by Letters Patent of the United States is:

1. A gain control circuit for selectively varying the dynamic range of a signal in electronic amplifying circuitry comprising signal transforming means having a primary winding and two secondary winding portions, means for applying an input signal to said primary winding, means for connecting said secondary winding portions whereby signals of opposite phase are produced between a common terminal of said secondary winding and, respectively, the first and the second end terminal of said secondary winding, a first junction diode and a first capacitor serially connected to the first end terminal, a second junction diode and a second capacitor serially connected to the second end terminal, means for connecting said first and second capacitor to a common input terminal of a load circuit, means for applying a fixed reference potential between said common terminal and the junction of said first junction diode and said first capacitor whereby said first junction diode is back-biased, means for applying a variable gain control voltage between said common terminal and the junction of said second junction diode and said second capacitor whereby said second junction diode is normally back-biased.

2. An attenuation control circuit for selectively varying the dynamic range of a signal comprising: signal transforming means having a primary winding and two secondary winding portions, means for applying an input signal to said primary winding, means for connecting said secondary winding portions whereby signals of opposite phase are produced between a common terminal of said secondary winding and, respectively, the first and second end terminal of said secondary winding, a junction diode and a first capacitor serially connected to the first end terminal, a reactive impedance approximating the impedance of said junction diode at a given reverse bias of said junction diode and a second capacitor serially connected to the second end terminal, means for connecting said first and second capacitor to a common terminal of a load circuit, means for applying a variable gain control voltage between said common terminal and the junction of said junction diode and said first capacitor whereby said junction diode is normally back biased.

3. An attenuation control arrangement comprising a semiconductor amplifier, first and second voltage-controllable capacitive impedances having a capacitive reactance which is a function of applied voltage, means for connecting one terminal of each of said impedances to the input terminal of the amplifier, means to obtain two signal components of opposite phase, means to apply one of the components of the signal to a second terminal of one of said impedances and the other component of the applied signal to a second terminal of the other of said impedances, means to apply a reference voltage to one of said impedances to maintain the value of said one of said impedances constant, and means to apply an attenuation control voltage to the other of said impedances to vary the impedance thereof, said attenuation control voltage being derived from the output of said semiconductor amplifier and being indicative of the intensity of a signal subsequent to amplification by the amplifier.

References Cited in the file of this patent

UNITED STATES PATENTS

| | | |
|---|---|---|
| 2,098,370 | Bartels | Nov. 9, 1937 |
| 2,191,315 | Guanella | Feb. 20, 1940 |
| 2,373,569 | Kannenberg | Apr. 10, 1945 |
| 2,548,913 | Schreiner | Apr. 17, 1951 |
| 2,808,474 | Maynard | Oct. 1, 1957 |
| 2,871,305 | Hurtig | Jan. 27, 1959 |
| 2,884,607 | Uhlir | Apr. 28, 1959 |
| 2,964,637 | Keizer | Dec. 13, 1960 |

FOREIGN PATENTS

| | | |
|---|---|---|
| 216,782 | Australia | Aug. 28, 1958 |